(12) United States Patent
Gunawan et al.

(10) Patent No.: US 9,806,211 B2
(45) Date of Patent: Oct. 31, 2017

(54) TANDEM SOLAR CELL WITH IMPROVED ABSORPTION MATERIAL

(71) Applicant: INTERNATIONAL BUSINESS MACHINES CORPORATION, Armonk, NY (US)

(72) Inventors: Oki Gunawan, Fair Lawn, NJ (US); Jeehwan Kim, Los Angeles, CA (US); David B. Mitzi, Mahopac, NY (US); Devendra K. Sadana, Pleasantville, NY (US); Teodor K. Todorov, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 119 days.

(21) Appl. No.: 14/727,071

(22) Filed: Jun. 1, 2015

(65) Prior Publication Data

US 2015/0263199 A1    Sep. 17, 2015

Related U.S. Application Data

(62) Division of application No. 13/037,798, filed on Mar. 1, 2011, now abandoned.

(51) Int. Cl.
*H01L 21/00* (2006.01)
*H01L 31/032* (2006.01)
(Continued)

(52) U.S. Cl.
CPC .......... *H01L 31/0326* (2013.01); *C23C 14/34* (2013.01); *C25D 7/12* (2013.01);
(Continued)

(58) Field of Classification Search
CPC ....... H01L 31/18; H01L 31/20; H01L 31/076; H01L 31/078; H01L 31/0326; C23C 14/34; C25D 7/12; Y02E 10/548
(Continued)

(56) References Cited

U.S. PATENT DOCUMENTS 4,536,607 A    8/1985  Wiesmann
6,121,541 A *  9/2000  Arya ................... H01L 31/0322
                                                136/249
(Continued)

FOREIGN PATENT DOCUMENTS

CN    100539204    9/2009
CN    101723336    6/2010
(Continued)

OTHER PUBLICATIONS

Chaure, N.B. et al "Electrodeposition of p+, p, i, n and n+-type copper indium gallium diselenide for development of multilayer thin film solar cells", 2005, Thin Solid Films 472, pp. 212-216.*
(Continued)

*Primary Examiner* — Tamir Ayad
(74) *Attorney, Agent, or Firm* — Tutunjian & Bitetto, P.C.; Louis J. Percello

(57) ABSTRACT

A photosensitive device and method includes a top cell having an N-type layer, a P-type layer and a top intrinsic layer therebetween. A bottom cell includes an N-type layer, a P-type layer and a bottom intrinsic layer therebetween. The bottom intrinsic layer includes a Cu—Zn—Sn containing chalcogenide.

20 Claims, 3 Drawing Sheets

(51) Int. Cl.
*H01L 31/18* (2006.01)
*H01L 31/076* (2012.01)
*H01L 31/078* (2012.01)
*C23C 14/34* (2006.01)
*C25D 7/12* (2006.01)
*H01L 31/20* (2006.01)

(52) U.S. Cl.
CPC .......... *H01L 31/076* (2013.01); *H01L 31/078* (2013.01); *H01L 31/18* (2013.01); *H01L 31/20* (2013.01); *Y02E 10/548* (2013.01)

(58) Field of Classification Search
USPC ................. 438/94; 204/192.25; 205/157
See application file for complete search history.

(56) References Cited

U.S. PATENT DOCUMENTS

| | | |
|---|---|---|
| 2006/0199313 A1 | 9/2006 | Harting et al. |
| 2007/0000538 A1 | 1/2007 | Shima |
| 2008/0135083 A1 | 6/2008 | Lai et al. |
| 2009/0130796 A1 | 5/2009 | Taunier et al. |
| 2010/0078059 A1 | 4/2010 | Lee |
| 2010/0147361 A1 | 6/2010 | Chen |
| 2012/0138866 A1* | 6/2012 | Agrawal ............... C23C 18/127 252/501.1 |

FOREIGN PATENT DOCUMENTS

| | | | |
|---|---|---|---|
| CN | 101840942 | 9/2010 | |
| JP | 5007907 | 8/2012 | |
| WO | WO 2010/138636 A2 * | 12/2010 | ........... H01L 31/042 |

OTHER PUBLICATIONS

Chen, Shiyou et al., "Crystal and electronic band structure of $Cu_2ZnSnX_4$ (X=S and Se) photovoltaic absorbers: First principles insights", 2009, Applied Physics Letters 94, 041903, pp. 1-3.*

Guo, Qijie et al., "Fabrication of 7.2% Efficient CZTSSe Solar Cells Using CZTS Nanocrytals", Nov. 19, 2010, J. Am. Chem. Soc. 2010, 132, pp. 17384-17386.*

Ennaoui, A. et al., "$Cu_2ZnSnS_4$ thin film solar cells from electroplated precursors: Novel low-cost perspective", Thin Solid Films 517 (2009), pp. 2511-2514.*

Andersson, A., "Materials Availability for Large-Scale Thin-Film Photovoltaics" Progress in Photovoltaics: Research and Applications. May 1999. pp. 61-76.

Gunawan, O., et al. "Loss Mechanisms in Hydrazine-Processed $Cu_2ZnSn(Se,S)_4$ Solar Cells" Applied Physics Letters. Dec. 2010. (3 pages).

Todorov, T., et al. "High-Efficiency Solar Cell With Earth-Abundant Liquid-Processed Absorber" Advanced Energy Materials. Feb. 2010. pp. E156-E159.

Patent Cooperation Treaty. "International Search Report and Written Opinion of the International Searching Authority" Issued for International Application No. PCT/US2012/022708. Jan. 2012. (10 pages).

* cited by examiner

TANDEM SOLAR CELL WITH IMPROVED ABSORPTION MATERIAL

This application is a Divisional application of co-pending U.S. patent application Ser. No. 13/037,798, filed on Mar. 1, 2011, incorporated herein by reference in its entirety.

BACKGROUND

Technical Field

The present invention relates to solar cells and more particularly to a tandem solar cell device and method to achieve greater collection efficiency.

Description of the Related Art

Solar cells employ photovoltaic cells to generate current flow. Photons in sunlight hit a solar cell or panel and are absorbed by semiconducting materials, such as silicon. Electrons gain energy allowing them to flow through the material to produce electricity.

When a photon hits silicon, the photon may be transmitted through the silicon, the photon can reflect off the surface, or the photon can be absorbed by the silicon, if the photon energy is higher than the silicon band gap value. This generates an electron-hole pair and sometimes heat, depending on the band structure. When a photon is absorbed, its energy is given to an electron in a crystal lattice. Electrons in the valence band may be excited into the conduction band, where they are free to move within the semiconductor. The bond that the electron(s) were a part of form a hole. These holes can move through the lattice creating mobile electron-hole pairs.

A photon need only have greater energy than that of a band gap to excite an electron from the valence band into the conduction band. Since solar radiation is composed of photons with energies greater than the band gap of silicon, the higher energy photons will be absorbed by the solar cell, with some of the energy (above the band gap) being turned into heat rather than into usable electrical energy.

A solar cell may be described in terms of a fill factor (FF). FF is a ratio of the maximum power point ($P_m$) divided by open circuit voltage ($V_{oc}$) and short circuit current $$(J_{sc}): FF = \frac{P_m}{V_{oc} J_{sc}}.$$

The fill factor is directly affected by the values of a cell's series and shunt resistance. Increasing the shunt resistance ($R_{sh}$) and decreasing the series resistance (Rs) will lead to a higher fill factor, thus resulting in greater efficiency, and pushing the cells output power closer towards its theoretical maximum. The increased efficiency of photovoltaic devices is of utmost importance in the current energy environment.

To increase efficiency, tandem cells have been employed where a first solar cell is integrated with a second solar cell. Such cells typically employ a microcrystalline Silicon based bottom cell, which includes microcrystalline Silicon for a p-doped layer, an intrinsic layer and an n-doped layer for the cell. These types of cells suffer from slow growth rates during manufacture. The growth rate for high quality microcrystalline cells may be about 2-3 Angstroms/sec for a 1.5 micron thickness, and can take 1-2 hours to grow the microcrystalline Silicon. This results in higher cost. In addition, since a top cell in such device also includes a form of Silicon, current sharing between the top and bottom cells is excessive, e.g., Jsc for the tandem device is often less than Jsc for an individual cell.

Thin-film materials of the type Cu(In,Ga)(S,Se)$_2$ (CIGS), while efficient, include rare indium metal, which is expected to be of high cost and short supply in future large-scale photovoltaic device production—an issue which is further exacerbated by the growing indium consumption for thin film display production. Other materials such as Cu$_2$S and CdTe have also been proposed as absorbers but while Cu$_2$S suffers from low stability in devices, rare tellurium and toxic cadmium limits CdTe usage.

SUMMARY

A photosensitive device and method includes a top cell having an N-type layer, a P-type layer and a top intrinsic layer therebetween. A bottom cell includes an N-type layer, a P-type layer and a bottom intrinsic layer therebetween. The bottom intrinsic layer includes a Cu—Zn—Sn containing chalcogenide.

A photosensitive device includes a top cell having an N-type layer, a P-type layer and a top intrinsic layer therebetween. A bottom cell has an N-type layer, a P-type layer and a bottom intrinsic layer therebetween. The bottom intrinsic layer includes a Cu—Zn—Sn containing chalcogenide compound with a kesterite structure of the formula: Cu$_{2-x}$Zn$_{1+y}$Sn(S$_{1-z}$Se$_z$)$_{4+q}$ wherein 0≤x≤1; 0≤y≤1; 0≤z≤1; −1≤q≤1, wherein z is controlled to adjust a band gap of the bottom cell to be lower than a band gap of the top cell.

A method for fabrication of a tandem photovoltaic device includes forming a bottom cell having an N-type layer, a P-type layer and a bottom intrinsic layer therebetween, wherein the bottom intrinsic layer includes a Cu—Zn—Sn containing chalcogenide; and forming a top cell over the bottom cell to form a tandem cell, the top cell having an N-type layer, a P-type layer and a top intrinsic layer therebetween.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
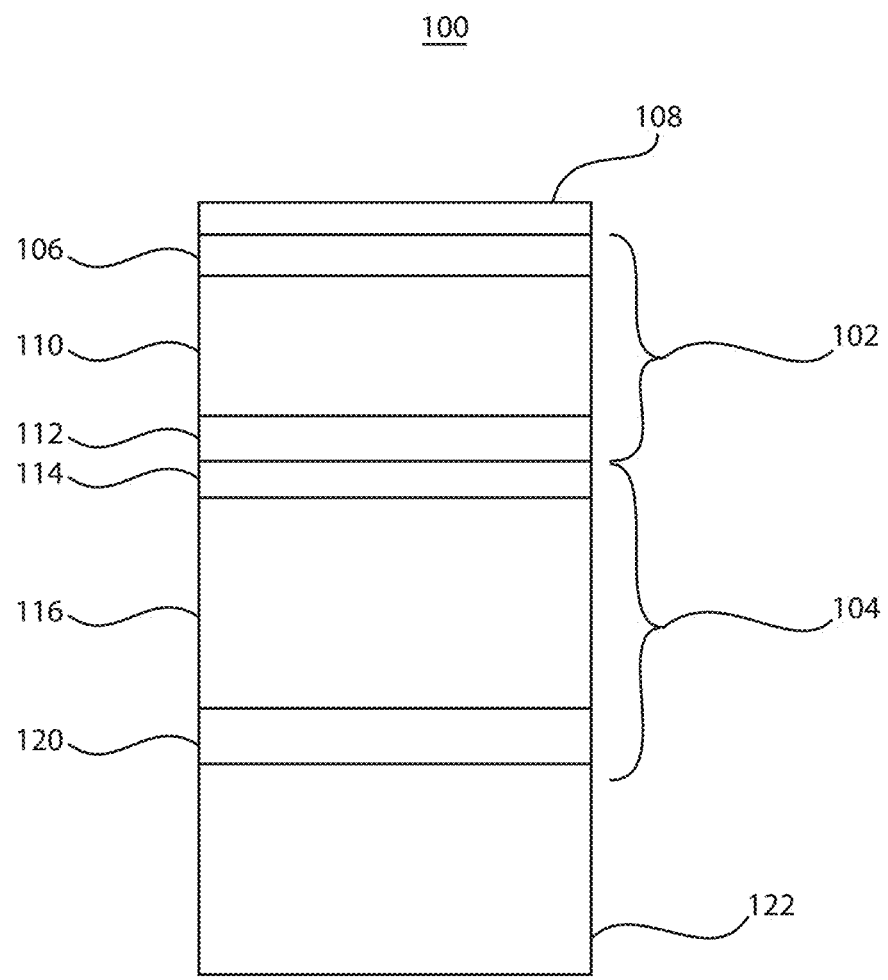
FIG. 1 is a cross-sectional view of an illustrative tandem cell device structure in accordance with the present principles.

In accordance with the present principles, a new tandem solar cell device structure is provided that increases productivity and performance over conventional cells which typically employ microcrystalline silicon bottom cells. Greater efficiency is provided at least in part by less current sharing between top and bottom cells in the tandem structure. Further, the present embodiments provide tandem cells composed of materials which are rapidly grown or applied with high quality. This makes the present embodiments more cost effective in addition to other advantages.

In one illustrative embodiment, a tandem cell is fabricated having a one cell fabricated using a Cu—Zn—Sn containing chalcogenide compound with a kesterite structure of the formula: $Cu_{2-x}Zn_{1+y}Sn(S_{1-z}Se_z)_{4+q}$ wherein $0 \leq x \leq 1$; $0 \leq y \leq 1$; $0 \leq z \leq 1$; $-1 \leq q \leq 1$. In a particularly useful embodiment, $Cu_2ZnSn(S, Se)_4$ (CZTS or CZTSe) is employed. CZTS has many benefits. It is low cost and environmentally harmless being fabricated using naturally abundant materials. CZTS provides good optical properties and has a band-gap energy from approximately 1 to 1.5 eV depending on the degree of substitution of S with Se and a large absorption coefficient in the order of $10^4$ cm$^{-1}$ Eliminating the reliance on rare indium metal (also heavily consumed by one of the fastest growing industries—thin film displays) opens the possibility of almost limitless material supply for production capacities well above 100GWp/year. The efficiency of CZTS, e.g., in the 10% range, can be maximized by making a tandem cell with amorphous silicon having higher band gap and thus allowing more effective light harvesting across the solar spectrum.

Aspects of the present invention are described below with reference to flowchart illustrations and/or block diagrams of methods and devices according to embodiments of the invention. The flowchart and block diagrams in the Figures illustrate the architecture, functionality, and operation of possible implementations according to various embodiments of the present invention. It should also be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved.

It is to be understood that the present invention will be described in terms of a given illustrative architecture for tandem cell photovoltaic devices; however, other architectures, structures, substrate materials and process features and steps may be varied within the scope of the present invention.

The devices described here may be part of a circuit and include a design for an integrated circuit chip, a photovoltaic device, a photosensitive circuit, etc. The design may be created in a graphical computer programming language, and stored in a computer storage medium (such as a disk, tape, physical hard drive, or virtual hard drive such as in a storage access network). The designer may transmit the resulting design by physical means (e.g., by providing a copy of the storage medium storing the design) or electronically (e.g., through the Internet) to entities, directly or indirectly. The stored design may be converted into the appropriate format (e.g., GDSII) for the fabrication of photolithographic masks, which typically include multiple copies of the design in question that are to be formed on a substrate. The photolithographic masks are utilized to define areas of the substrate (and/or the layers thereon) to be etched or otherwise processed.

The methods as described herein may be used in the fabrication of integrated circuit chips, a photovoltaic device, a photosensitive circuit, etc. The device may be integrated with other chips, discrete circuit elements, and/or other signal processing devices as part of either (a) an intermediate product, such as a printed wiring board, or (b) an end product. The end product can be any product that includes devices, ranging from toys and other low-end applications to advanced computer products having a display, a keyboard or other input device, and a central processor.

Referring now to the drawings in which like numerals represent the same or similar elements and initially to FIG. 1, an illustrative tandem photovoltaic structure 100 is illustratively depicted in accordance with one embodiment. The photovoltaic structure 100 may be employed in solar cells, light sensors, photosensitive devices or other photovoltaic applications. The embodiment depicted in FIG. 1 includes two cells 102 and 104 stacked in tandem.

A top cell 102 includes a first doped layer 106 which may include amorphous silicon (e.g., a-Si:H) or other suitable materials for thin film solar cells. In this embodiment, the first doped layer 106 includes an N-type (n+) doping. A layer 108 may include a transparent electrode (transparent conducting oxide (TCO)). The first layer 106 provides a first doping layer for the top cell 102.

An intrinsic layer 110 includes a material compatible with layer 106 and a layer 112. The intrinsic layer 110 is undoped. In one illustrative embodiment, layer 110 includes amorphous silicon (a-Si:H) although other materials may also be employed. The intrinsic layer 110 may have a thickness of between about 100 to 300 nm.

Layer 112 has an opposite polarity relative to the layer 106 (e.g., if layer 106 is N-type then layer 112 is P-type or vice versa). In this example, layer 112 is a P-type material and layer 106 is an N-type material. In this embodiment, layer 112 may include a P-type (p+) microcrystalline silicon (µc-Si:H) layer. Layer 112 is preferably thin, e.g., 1 nm to about 10 nm, and more preferably around 5 nm. Layer 112 forms a second doped layer of the top cell 102. Different combinations of materials may be employed to form the photovoltaic stack for cell 102, for example, a-SiC:H or other higher band-gap materials. The top cell 102 is preferably formed to have band gap materials that have a higher band gap than the materials in bottom cell 104.

Layers 106, 110 and 112 form the top cell 102 and layers 114, 116, and 120 form the bottom cell 104 to provide the double junction device 100. The tandem cells 102 and 104 are configured such that light/radiation passing through the top cell 102 has a high likelihood of being absorbed in the bottom cell 104.

Between layers 112 and 114, which may be tunnel junctions, hydrogen plasma may be applied on layer 114 to enhance the crystallinity of the subsequently grown layer 112 on layer 114 so that conductivity of the tunnel junction can be improved.

In one embodiment, the bottom cell 104 employs a layer 120 on a substrate 122. The layer 120 may include molybdenum although other high work-function materials may be employed (e.g., Pt, Au, etc.). The substrate 122 may include glass or other inexpensive substrates, such as metal, plastic, etc. The layer 120 provides a metal contact while layer 114 is an N-type material (e.g., n-CdS). Layer 120 (e.g., Mo layer) can be thicker than layer 114 to enable sufficient conductivity for adequate series resistance.

The layer 114 may include CdS or other materials that serve as an N-type layer. Layer 116 includes a Cu—Zn—Sn containing chalcogenide compound with a kesterite structure of the formula: $Cu_{2-x}Zn_{1+y}Sn(S_{1-z}Se_z)_{4+q}$ wherein $0 \leq x \leq 1$; $0 \leq y \leq 1$; $0 \leq z \leq 1$; $-1 \leq q \leq 1$. The Cu—Zn—Sn-containing chalcogenide, such as a $Cu_2ZnSn(S,Se)_4$ (CZTS) based thin film, serves as a P-type material. In one embodiment, the CZTS film has a thickness of between about 0.2 to 4.0 microns and more preferably about 2 microns. Layer 116 may be formed by painting, sputtering, electroplating, spin coating or other simple coating processes. The process of forming layer 116 is reduced to a few minutes or less from the hours required in forming a microcrystalline silicon layer in conventional devices.

Layer 114 is preferably thin, e.g., 1 nm to about 10 nm, more preferably around 5 nm. The layer 114 provides an N-type layer for the bottom cell 104. The intrinsic layer 116 contacts layer 114 and layer 120. The intrinsic layer 116 is undoped or slightly p-doped. In one illustrative embodiment, intrinsic layer 116 includes CZTS (or CZTS with some Se substituted for S) which provides a band gap ($E_g$) from about 1 to 1.5 eV. It is desirable that the band gap of the intrinsic layer 110 of the top cell 102 be greater than the band gap of the bottom cell 104. Layer 120 forms a bottom electrode of the bottom cell 104.

The deposition sequence can be completely opposite for a superstrate configuration (e.g., where light instead comes from the substrate 122). In this case, a top a-Si:H or a-SiC:H cell is deposited on top of a TCO/glass substrate (122). Then, the bottom cell (with CZTS) is formed by forming a p-type tunnel junction on top of the top intrinsic layer of the top cell. Molybdenum would be deposited for the electrode, the CZTS absorber is formed and then capped with CdS.

It should be understood that the CZTS process temperature should not exceed ~250 degrees C. since hydrogen in a-Si:H starts being evaporated out such that there is no more H passivation on broken bonds.

Tandem cell device 100 is fabricated to maximize $V_{OC}$ and improve current matching between each junction. Multiple junctions are formed together so that the $V_{OC}$ of each junction is cumulatively added resulting in a high $V_{oc}$ for the multi junction device due to the tandem cells. The $J_{SC}$ of the tandem cell device 100 is controlled by a single junction device, i.e., the device with the lowest $J_{SC}$. To increase the performance of the device 100, it is desirable that any radiation that passes through the top cell 102 is absorbed in the bottom cell 104 (or middle cells if available). This is achieved by providing energy gap splitting ($E_g$ splitting). For example, the top cell 102 has higher band gap materials and receives light first. The light spectra that is not absorbed at the top cell 102 enters the bottom cell 104. A larger band gap difference between two different junctions is better to prevent the light spectra from being shared between the junctions to maximize photocurrent. Energy gap splitting permits the absorption of radiation with different energies between the cells. Since the band gap of the top cell 102 is maintained at a higher level, the lower level cell (104) or cells are designed to have a lower band gap. In this way, the lower cells have a higher probability of absorbing transmitted radiation, and the entire tandem cell becomes more efficient since there are fewer photon energy levels shared between the layered cells. This results in increased probability of absorbing light passing through to the bottom cell 104 hence increasing the current in the bottom cell 104, increasing $J_{SC}$. It is preferable that a greater difference between band gaps exists between the top cell 102 (higher band gap), and the bottom cell 104 (lower band gap) by keeping an absolute high level of band gap energy for both cells to maintain high $V_{oc}$. If separating $E_g$ by reducing the band gap of the bottom cell is excessive, there will be Voc loss.

It should be understood that while a double junction tandem device is shown and described with respect to FIG. 1, additional junctions may be added as needed to provide a triple junction, etc. For example, the tandem device 100 may include at least one middle cell having an N-type layer, a P-type layer and a middle intrinsic layer therebetween which preferably includes a band gap energy between that of the top intrinsic layer and the bottom intrinsic layer.

Figure 2A:
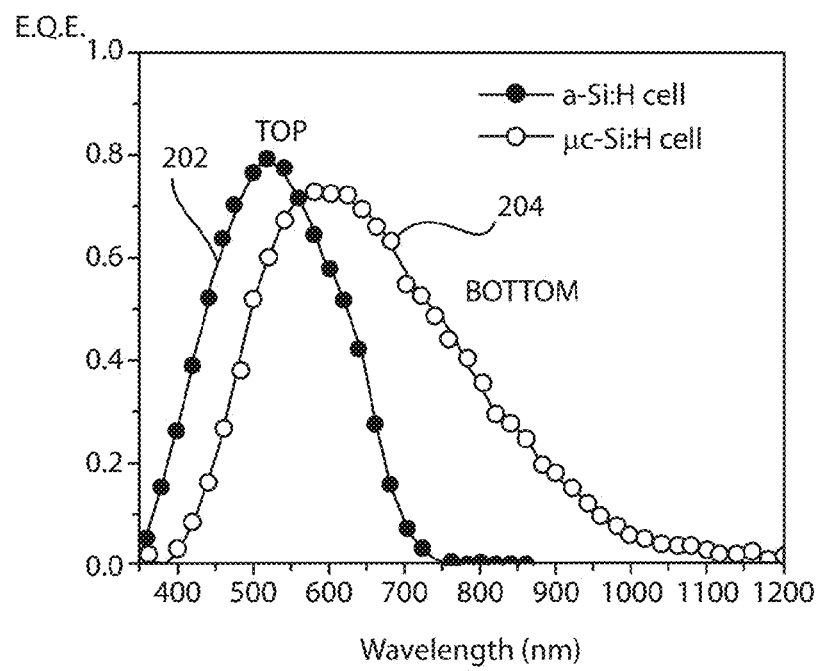
FIG. 2A is a plot of external quantum efficiency (EQE) versus wavelength for top and bottom cells of a conventional tandem cell.

Referring to FIG. 2A, a plot of external quantum efficiency (EQE) versus wavelength is shown for a conventional thin film silicon tandem cell. The tandem cell in FIG. 2A includes an amorphous silicon top cell and a microcrystalline silicon bottom cell. Plot 202 shows the top cell response, and plot 204 shows the bottom cell response for the microcrystalline silicon bottom cell over a wavelength range of 350-1200 nm.

Figure 2B:
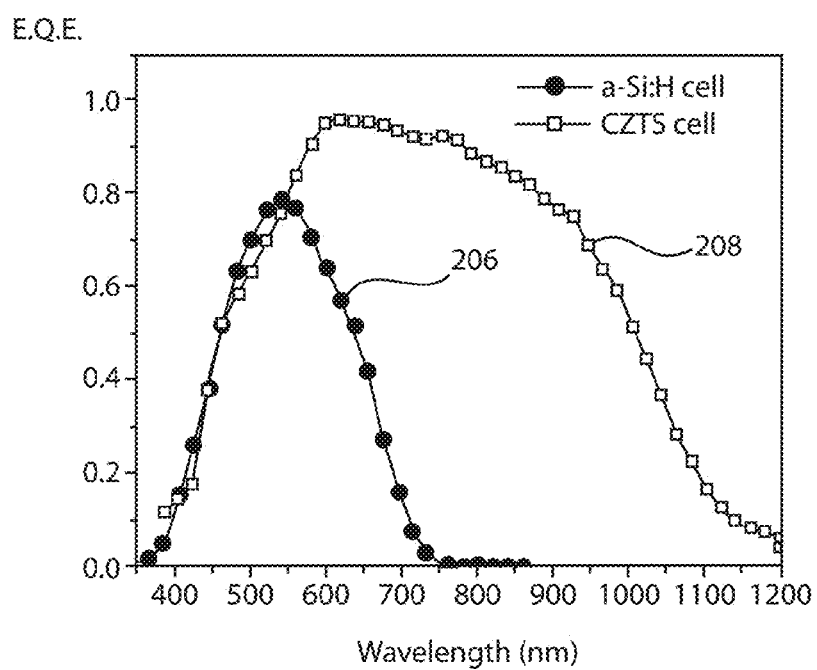
FIG. 2B is a plot of external quantum efficiency (EQE) versus wavelength for top and bottom cells of a tandem cell in accordance with the present principles.

Referring to FIG. 2B, a plot of external quantum efficiency (EQE) versus wavelength is shown for a tandem cell in accordance with the present principles. The tandem cell in FIG. 2B includes an amorphous silicon top cell and a CZTS bottom cell. Plot 206 shows the top cell response, which is the same response as in FIG. 2A since the structure is the same for the top cell in plots 202 and 206. A plot 208 shows the bottom cell response for the CZTS bottom cell over a wavelength range of 350-1200 nm. Note that there significantly less wavelength overlap between the top cell plot 206 and the bottom cell plot 208 than in FIG. 2A. This translates to a greater amount of radiation absorption with less competition for the same wavelength light between cells.

EQE is a quantity defined for a photosensitive device as the percentage of photons hitting the photoreactive surface that will produce an electron—hole pair (measurement of the device's electrical sensitivity to light at a certain wavelength). Since the energy of a photon is inversely proportional to its wavelength, EQE is measured over a range of different wavelengths to characterize a device's efficiency at each photon energy. The quantum efficiency of a solar cell gives information on the current that a given cell will produce when illuminated by a particular wavelength. If the quantum efficiency is integrated (summed) over the whole solar electromagnetic spectrum (area under the curve), the current that a cell will produce when exposed to the solar spectrum can be determined.

As can be seen, from plot 204 in FIG. 2A and plot 208 in FIG. 2B, the area under the EQE curve is significantly larger for the bottom cell with the CZTS in FIG. 2B. Note for example, the plot rises to almost 1.0 at a wavelength of about 600 nm and is significantly higher over the entire spectrum as compared with plot 204 in FIG. 2A.

With solar cells, EQE is the current obtained outside the device per incoming photon. EQE=(electrons/sec)/(photons/sec), and the efficiency=output/input. EQE therefore depends on both the absorption of light and the collection of charge. Once a photon has been absorbed and has generated an electron-hole pair, these charges need to be separated and collected at the junction.

Table I shows illustrative data for different device types. Table I includes open circuit voltage (Voc), short circuit current (Jsc), fill factor (FF) and Efficiency.

TABLE I

| | Cell Parameters: | | | |
|---|---|---|---|---|
| Device Type | Voc (V) | Jsc (mA/cm²) | FF (%) | Efficiency (%) |
| Conventional a-Si/μc-Si | 1.4 | 12 | 73 | 12.3 |
| Tandem a-Si/CZTS | 1.4 | 15~16 | 73 | 15~16 |

Single cell devices include efficiencies in the 9% range. Even a stand-alone CZTS device has a measured efficiency of about 9.6%. The conventional a-Si/μc-Si tandem cell provides an efficiency of about 12.3%. The tandem a-Si/CZTS in accordance with the present principles provides an expected efficiency of about 15-16% representing a significant gain in efficiency with lower production costs and lower material costs.

Figure 3:
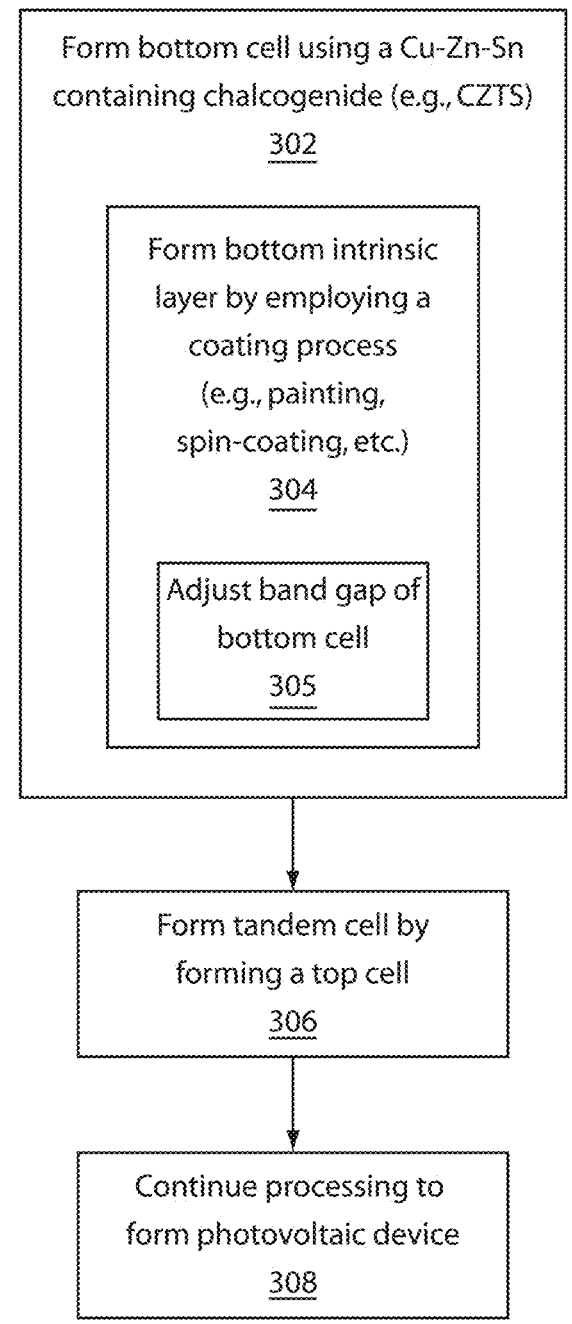
FIG. 3 is a flow diagram showing a method for fabricating a tandem cell in accordance with the present principles.

Referring to FIG. 3, a flow diagram for fabrication of a tandem photovoltaic device is illustratively shown in accordance with one embodiment. In block 302, a bottom cell is formed. The bottom cell includes an N-type layer, a P-type layer and a bottom intrinsic layer formed therebetween. The bottom cell may be formed on a substrate, such as a glass substrate or the like. The bottom intrinsic layer includes a Cu—Zn—Sn containing chalcogenide compound with a kesterite structure of the formula: $Cu_{2-x}Zn_{1+y}Sn(S_{1-z}Se_z)_{4+q}$ wherein $0 \leq x \leq 1$; $0 \leq y \leq 1$; $0 \leq z \leq 1$; $-1 \leq q \leq 1$.

The bottom cell preferably includes molybdenum as a back contact layer formed on a glass substrate, although other high work-function metals may be employed (e.g., Pt, Au, etc.). The bottom cell preferably includes a layer of cadmium sulfide as the N-type layer, although other N-type layers can also be employed, including, e.g., ZnS, Zn(O,S) (zinc oxysulfide), $In_2S_3$ and ZnO.

In block 304, the bottom intrinsic layer can be prepared by any standard vacuum or non-vacuum deposition technique. In useful embodiments, the bottom intrinsic layer can be prepared by evaporation, sputtering, electroplating, casting, spraying (painting) and printing. The bottom intrinsic layer is preferably formed by an ink-based coating or printing process. A liquid, ink-based technique is suitable for large-scale low-cost manufacturing. The coating process is preferably performed in the order of minutes and more preferably in less than one minute.

An example preparation of a $Cu_2ZnSn(S,Se)_4$ film by ink (slurry) spin coating includes the following. All operations were performed in a nitrogen-filled glove box. The deposition solution was prepared in two parts in glass vials under magnetic stirring: Part A1 was formed by dissolving $Cu_2S$, 0.573 g and sulfur, 0.232 g in 3 ml of hydrazine and part B1 was formed by mixing SnSe, 0.790 g, Se, 1.736 g and Zn, 0.32 g with 7 ml of hydrazine. After 3 days under magnetic stirring, solution A1 had an orange transparent aspect, while B1 was dark green and opaque. Solutions A1 and B1 were mixed (C1) before deposition.

Films were deposited on soda lime glass substrates coated with 700 nm molybdenum by spin coating at 800 rpm and heated at 540° C. for 2 minutes. The coating and heating cycle were repeated 5 times before a final anneal was carried out for 10 minutes.

In block 305, for $Cu_{2-x}Zn_{1+y}Sn(S_{1-z}Se_z)_{4+q}$ where $0 \leq x \leq 1$; $0 \leq y \leq 1$; $0 \leq z \leq 1$; $-1 \leq q \leq 1$, z is controlled during formation to adjust a band gap of the bottom cell. The tandem cell in accordance with the present principles has a band gap of the bottom cell intrinsic layer controlled to be lower than a band gap of the top cell. The optical band gap may be tuned from approximately 1 to 1.5 eV by controlled substitution of the sulfur with selenium.

In block 306, a top cell is formed over the bottom cell to form a tandem cell. The top cell has an N-type layer, a P-type layer and a top intrinsic layer therebetween. The top cell may include amorphous silicon as the top intrinsic layer, doped amorphous silicon as the N-type layer and doped microcrystalline silicon as the P-type layer. Other materials may be employed for the top cell as well, e.g., SiC, etc.

In block 308, processing is continued to complete the device. It should be understood that the N-type and P-type layer may be switched relative to each intrinsic layer. Further, in some embodiments, the top cell may be formed first followed by the bottom cell. In other embodiments, additional cells (e.g., middle cells) may be fabricated in the tandem device.

Having described preferred embodiments for a tandem cell device and method for forming (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for fabrication of a tandem photovoltaic device, comprising:
    forming a bottom cell having an N-type layer, a P-type layer and a bottom intrinsic layer therebetween, wherein the bottom intrinsic layer includes a Cu—Zn—Sn containing chalcogenide and is formed by applying a deposition solution in a nitrogen-filled container, the deposition solution comprising a first proportional part consisting of about 0.573 g $Cu_2S$ and about 0.232 g S in about 3 ml of hydrazine and a second proportional part consisting of about 0.790 g SnSe, about 1.736 g Se, and about 0.32 g Zn in about 7 ml of hydrazine; and
    forming a top cell over the bottom cell to form a tandem cell, the top cell having an N-type layer, a P-type layer and a top intrinsic layer therebetween.

2. The method as recited in claim 1, wherein the Cu—Zn—Sn containing chalcogenide includes a kesterite structure of a formula: $Cu_{2-x}Zn_{1+y}Sn(S_{1-z}Se_z)_{4+q}$ wherein $0 \leq x \leq 1$; $0 \leq y \leq 1$; $0 < z \leq 1$; $-1 \leq q \leq 1$.

3. The method as recited in claim 2, further comprising adjusting z to control a band gap of the bottom intrinsic layer such that the band gap of the bottom cell is lower than a band gap of the top cell.

4. The method as recited in claim 1, wherein the bottom cell includes molybdenum as the P-type layer formed on a glass substrate.

5. The method as recited in claim 1, wherein the bottom cell includes a layer of cadmium sulfide as the N-type layer.

6. The method as recited in claim 1, wherein the top cell includes amorphous silicon as the top intrinsic layer.

7. The method as recited in claim 1, wherein the top cell includes doped amorphous silicon as the N-type layer and includes doped microcrystalline silicon as the P-type layer.

8. The method as recited in claim 1, wherein the bottom intrinsic layer is formed by a coating process.

9. The method as recited in claim 8, wherein the coating process is performed in less than one minute.

10. The method as recited in claim 8, wherein the coating process includes an ink deposition.

11. The method as recited in claim 8, wherein the coating process includes electroplating.

12. The method as recited in claim 1, wherein applying the deposition solution further comprises depositing a mixture of the first part and the second part on the bottom P-type layer by spin coating at about 800 rpm and heating the mixture at about 540° C. for about 2 minutes.

13. The method as recited in claim 12, wherein the ink deposition comprises a five-time repetition of applying the deposition solution and heating the mixture.

14. The method of claim 1, wherein the bottom intrinsic layer is formed to a thickness between about 0.2 μm and about 4.0 μm.

15. A method for fabrication of a tandem photovoltaic device, comprising:

forming a bottom cell having an N-type layer, a P-type layer and a bottom intrinsic layer therebetween, wherein the bottom intrinsic layer includes a Cu—Zn—Sn containing chalcogenide and is formed by applying a deposition solution on the bottom cell P-type layer by spin-coating at about 800 rpm and heating the deposition solution at about 540° C. for about 2 minutes in a nitrogen-filled container, the deposition solution comprising a mixture of a first proportional part consisting of about 0.573 g $Cu_2S$ and about 0.232 g S in about 3 ml of hydrazine and a second proportional part consisting of about 0.790 g SnSe, about 1.736 g Se, and about 0.32 g Zn in about 7 ml of hydrazine; and forming a top cell over the bottom cell to form a tandem cell, the top cell having an N-type layer, a P-type layer and a top intrinsic layer therebetween.

16. The method as recited in claim 15, wherein the bottom cell includes molybdenum as the P-type layer formed on a glass substrate.

17. The method as recited in claim 15, wherein the bottom cell includes a layer of cadmium sulfide as the N-type layer.

18. The method as recited in claim 15, wherein the top cell includes amorphous silicon as the top intrinsic layer.

19. The method as recited in claim 15, wherein the top cell includes doped amorphous silicon as the N-type layer and includes doped microcrystalline silicon as the P-type layer.

20. The method of claim 15, wherein the bottom intrinsic layer is formed to a thickness between about 0.2 μm and about 4.0 μm.

\* \* \* \* \*